United States Patent
Khenkin et al.

(10) Patent No.: US 9,769,562 B2
(45) Date of Patent: Sep. 19, 2017

(54) MICROPHONE SYSTEM WITH NON-ORTHOGONALLY MOUNTED MICROPHONE DIE

(71) Applicant: Invensense, Inc., San Jose, CA (US)

(72) Inventors: Aleksey S. Khenkin, Nashua, NH (US); Vikram Venkatadri, Lowell, MA (US); David Bolognia, North Andover, MA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 14/957,054

(22) Filed: Dec. 2, 2015

(65) Prior Publication Data

US 2016/0088389 A1  Mar. 24, 2016

Related U.S. Application Data

(63) Continuation of application No. 13/746,488, filed on Jan. 22, 213, now Pat. No. 9,226,052.

(51) Int. Cl.

| | |
|---|---|
| *H04R 9/08* | (2006.01) |
| *H04R 11/04* | (2006.01) |
| *H04R 17/02* | (2006.01) |
| *H04R 19/04* | (2006.01) |
| *H04R 21/02* | (2006.01) |
| *H04R 1/32* | (2006.01) |
| *H04R 1/04* | (2006.01) |
| *H04R 1/08* | (2006.01) |
| *H04R 1/00* | (2006.01) |

(52) U.S. Cl.
CPC ............ *H04R 1/326* (2013.01); *H04R 1/00* (2013.01); *H04R 1/04* (2013.01); *H04R 1/083* (2013.01); *H04R 9/08* (2013.01); *H04R 11/04* (2013.01); *H04R 17/02* (2013.01); *H04R 21/02* (2013.01); *H01L 2224/48091* (2013.01); *H04R 2201/003* (2013.01)

(58) Field of Classification Search
CPC .......... H04R 9/08; H04R 11/04; H04R 21/02; H04R 1/04; H04R 1/083; H04R 2201/003
USPC ........................................................ 381/355
See application file for complete search history.

(56) References Cited

U.S. PATENT DOCUMENTS

| | | | |
|---|---|---|---|
| 7,680,292 B2 | 3/2010 | Warren et al. | |
| 7,763,488 B2 | 7/2010 | Goodelle et al. | |
| 7,902,843 B2 * | 3/2011 | Fang | G01L 9/0073 324/658 |

(Continued)

FOREIGN PATENT DOCUMENTS

| | | |
|---|---|---|
| EP | 2487935 | 8/2012 |
| GB | 2218303 | 11/1989 |

*Primary Examiner* — Duc Nguyen
*Assistant Examiner* — Sean H Nguyen
(74) *Attorney, Agent, or Firm* — Maryam Imam; Klintworth & Rozenblat IP LLP (57) ABSTRACT

A microphone system has a lid coupled with a base to form a package with an interior chamber. The package has a top, a bottom, and a plurality of sides, and at least one of those sides has a portion with a substantially planar surface forming an opening for receiving an acoustic signal. The microphone system also has a microphone die positioned within the interior chamber. The microphone is positioned at a non-orthogonal, non-zero angle with regard to the opening in the at least one side.

9 Claims, 8 Drawing Sheets

(56) References Cited

U.S. PATENT DOCUMENTS

| | | |
|---|---|---|
| 2007/0230734 A1 | 10/2007 | Beard |
| 2008/0044040 A1 | 2/2008 | Werner, Jr. et al. |
| 2008/0063232 A1 | 3/2008 | Song |
| 2009/0185697 A1 | 7/2009 | Matsui |
| 2010/0128914 A1* | 5/2010 | Khenkin .............. H04R 19/005 381/361 |
| 2010/0322443 A1 | 12/2010 | Wu et al. |
| 2013/0032905 A1* | 2/2013 | Lo ........................... B81B 7/007 257/416 |

* cited by examiner

MICROPHONE SYSTEM WITH NON-ORTHOGONALLY MOUNTED MICROPHONE DIE

PRIORITY

This application is a continuation application of U.S. patent application Ser. No. 13/746,488, filed on Jan. 22, 2013, by Alex Khenkin, et al., and entitled "Microphone System with Non-Orthogonally Mounted Microphone Die", the disclosure of which is incorporated herein, in its entirety, by reference.

FIELD OF THE INVENTION

The invention generally relates to microphones and, more particularly, the invention relates to packages for microphones.

BACKGROUND OF THE INVENTION

MEMS microphones are used in a growing number of devices, such as mobile telephones, laptop computers, voice recorders, hearing instruments, and other electronic devices. To those ends, MEMS microphone dies typically are mounted within a package interior and controlled by an adjacent integrated circuit die. For example, a MEMS microphone package may include a substrate, such as an FR-4 based printed circuit board (PCB), a MEMS microphone die attached to the substrate, and a cup-shaped lid attached to the substrate to create a package. The interior of the package forms an interior chamber that protects the fragile MEMS microphone die from the environment.

The interior chamber is not completely isolated, however, from the external environment. Specifically, the package also has an aperture to permit communication between the microphone die and an acoustic signal generated outside of the package. For example, to permit access of an acoustic signal into the package, the substrate may form a through-hole aperture under the microphone die. The acoustic signal thus enters through the aperture, and strikes the diaphragm portion of the microphone die, causing the die to generate corresponding electrical signals.

Ergonomic considerations of an underlying device (e.g., a hearing instrument) often can cause the microphone aperture to be located in a region or wall with very little clearance. The art has responded to this by locating some microphone package apertures in the smaller side walls of the package. Use of the side wall for the aperture, however, can produce an undesirable acoustic path between the hole and the microphone die.

SUMMARY OF VARIOUS EMBODIMENTS

In accordance with one embodiment of the invention, a microphone system has a lid coupled with a base to form a package with an interior chamber. The package has a top, a bottom, and a plurality of sides, and at least one of those sides has a portion with a substantially planar surface forming an opening for receiving an acoustic signal. The microphone system also has a microphone die positioned within the interior chamber. The microphone is positioned at a non-orthogonal, non-zero angle with regard to the opening in the at least one side.

The microphone system also may have a ramped portion with a channel acoustically coupled with the opening. The ramped portion may have a securing surface forming a non-orthogonal angle with regard to the opening. The microphone die preferably is secured to the securing surface of the ramped portion, and the channel may acoustically couple the opening and the microphone die. The channel further may have a contour configured to direct an acoustic signal in a direction that is substantially orthogonal to the diaphragm of the microphone die.

Among other things, the system further may have a substrate secured with the base. To control the microphone die, the substrate may support a circuit die, and a wire bond can electrically connect the microphone die with the circuit die. Moreover, the base may have an interior face, with first and second portions, within the interior chamber. The noted second portion of the base may form an obtuse angle with the first portion, and the die may be secured to the second portion.

Some embodiments form at least one location protrusion on the base adjacent to the lid. In addition or alternatively, to ensure sufficient functionality, the package may be configured to mitigate electromagnetic interference. For example, one or both of the base and lid can include injection molded material and conductive material to mitigate electromagnetic interference. The ultimately formed package may be configured to be surface mountable, or mountable to an exterior circuit board by some other means. In some embodiments, the microphone die may be positioned at a non-orthogonal, non-zero angle with regard to a plurality of the external side faces of the package and/or the top/bottom package faces.

In accordance with another embodiment of the invention, a microphone system has a lid coupled with a base that forms a package with an interior chamber. The package has a plurality of exterior sides that together form a generally rectangular exterior shape. To provide signal access to the interior chamber, the package has an opening formed through one of its exterior sides. Specifically, the opening acoustically couples the interior chamber with the exterior of the package. The system also has a MEMS microphone die mounted within the interior chamber at a non-orthogonal, non-zero angle to the opening.

In accordance with other embodiments of the invention, a method of forming a microphone system provides a base and a lid, and secures a microphone die to one of the base and the lid. The method also secures the base to the lid to form a package having an interior chamber containing the microphone die. The package has a plurality of exterior sides that together form a generally rectangular exterior shape, and at least one of the plurality of exterior sides forms an opening for receiving an acoustic signal into the interior chamber. The microphone die is positioned within the interior chamber at a non-orthogonal, non-zero angle to at least one of the exterior sides.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, a packaged microphone has a microphone die mounted in a manner that delivers high-quality output signals while, at the same time, permitting use with smaller package form factors (e.g., within hearing instruments). To that end, the microphone die is mounted at an angle to its acoustic signal access port. This can have significant benefits in a wide variety of microphone types, including side port microphones commonly used in hearing instruments. For example, this design aligns the microphone die to more favorably receive an incoming acoustic signal (i.e., at a more favorable strike angle), thus producing an improved signal. Moreover, it may enlarge the back volume, thus further enhancing system performance. Details of illustrative embodiments are discussed below.

Figure 1A:
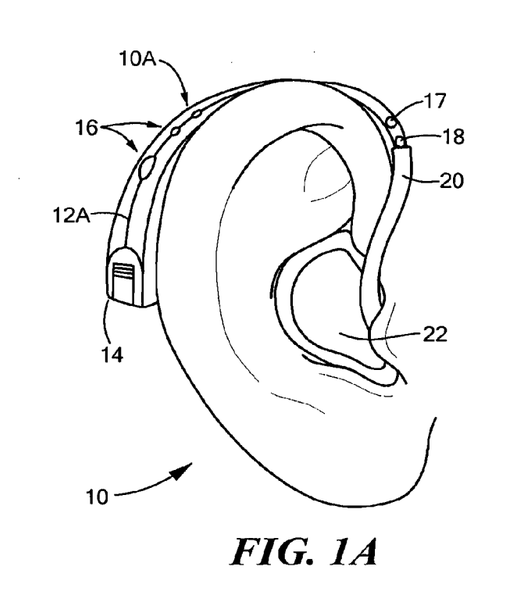
FIGS. 1A-1D schematically show a plurality of different types of hearing aids that may incorporate illustrative embodiments of the invention.
Figure 1B:
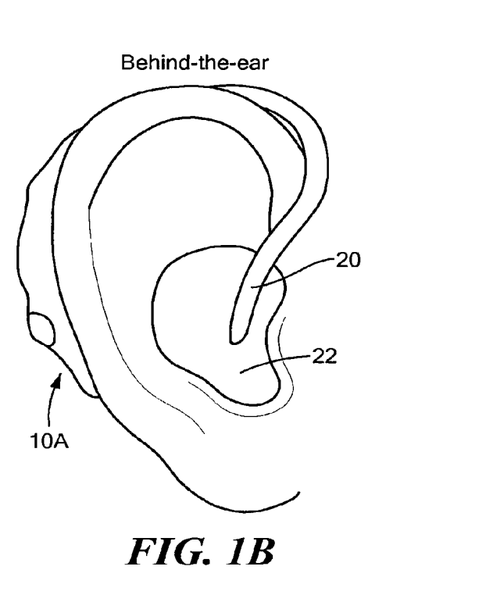
Figure 1C:
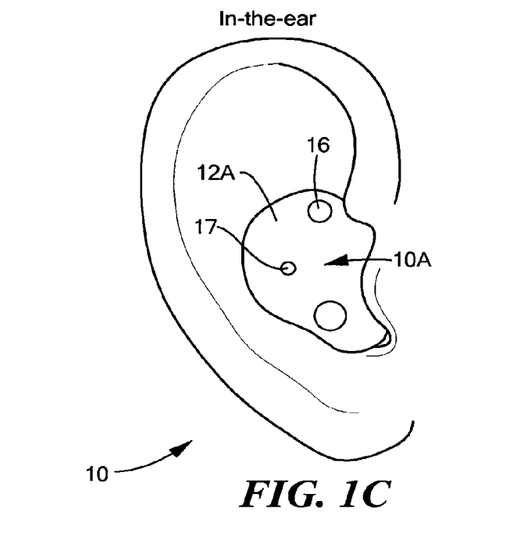
Figure 1D:
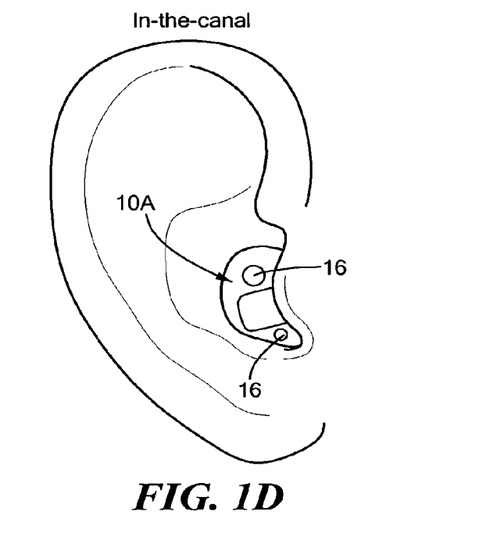

FIGS. 1A-1D illustratively show various different types of hearing aids 10A that may incorporate microphone systems implementing illustrative embodiments of the invention. FIGS. 1A and 1B show different "behind the ear" types of hearing aids 10A that, as their name suggests, have a significant portion secured behind a person's ear during use. In contrast, FIGS. 1C and 1D show hearing aids 10A that do not have a component behind the ear. Instead, these types of hearing aids 10A mount within the ear. Specifically, FIG. 1C shows an "in-the-ear" hearing aid 10A which, as its name suggests, mounts in-the-ear, while FIG. 1D shows an "in-the-canal" hearing aid 10A which, as its name suggests, mounts more deeply in the ear—namely, in the ear canal.

With reference to FIG. 1A, the intelligence, sensors (e.g., microphone systems 17, discussed in greater detail below with regard to FIGS. 3-7), and logic of the behind the ear type of hearing aid 10A lies primarily within a housing 12A that mounts behind the ear. To that end, the housing 12A forms an interior that contains internal electronics for processing audio signals, a battery compartment 14 (a powering module) for containing a battery (not shown) that powers the hearing aid 10A, and mechanical controlling features 16, such as knobs, for controlling the internal electronics. In addition, the hearing aid 10A also includes a microphone system 17 (e.g., including a packaged microphone die, also referred to using reference number 17) for receiving audio signals, and a speaker 18 for transmitting amplified audio signals received by the packaged microphone 17 and processed by the internal electronics. A hollow tube 20 directly connected to the end of the hearing aid 10A, right near the speaker 18, channels these amplified signals into the ear. To maintain the position of this tube 20 and mitigate undesired feedback, the hearing aid 10A also may include an ear mold 22 (also part of the body of the hearing aid 10A) formed from soft, flexible silicone molded to the shape of the ear opening.

Among other things, the hearing aid 10A may have circuitry and logic for optimizing the signal generated through the speaker 18. More specifically, the hearing aid 10A may have certain program modes that optimize signal processing in different environments. For example, this logic may include filtering systems that produce the following programs:

normal conversation in a quiet environment,
normal conversation in a noisy environment,
listening to a movie in a theater, and
listening to music in a small area.

The hearing aid 10A also may be programmed for the hearing loss of a specific user/patient. It thus may be programmed to provide customized amplification at specific frequencies. Some of this functionality can be implemented within its internal microphone system 17.

The other two types of hearing aids 10A typically have the same internal components, but in a smaller package. Specifically, the in-the-ear hearing aid 10A of FIG. 1C has a flexible housing 12A, with the noted internal components, molded to the shape of the ear opening. In particular, among other things, those components include a microphone 17 facing outwardly for receiving audio signals, a speaker (not shown) facing inwardly for transmitting those signals into the ear, and internal logic for amplifying and controlling performance.

The in-the-canal hearing aid 10A of FIG. 1D typically has all the same components, but in a smaller package to fit in the ear canal. Some in-the-canal hearing aids 10A also have an extension (e.g., a wire) extending out of the ear to facilitate hearing aid removal. Because they fit in tight spots (e.g., behind the ear or in the ear canal), space for internal system components (e.g., microphones) is at a premium.

Figure 2:
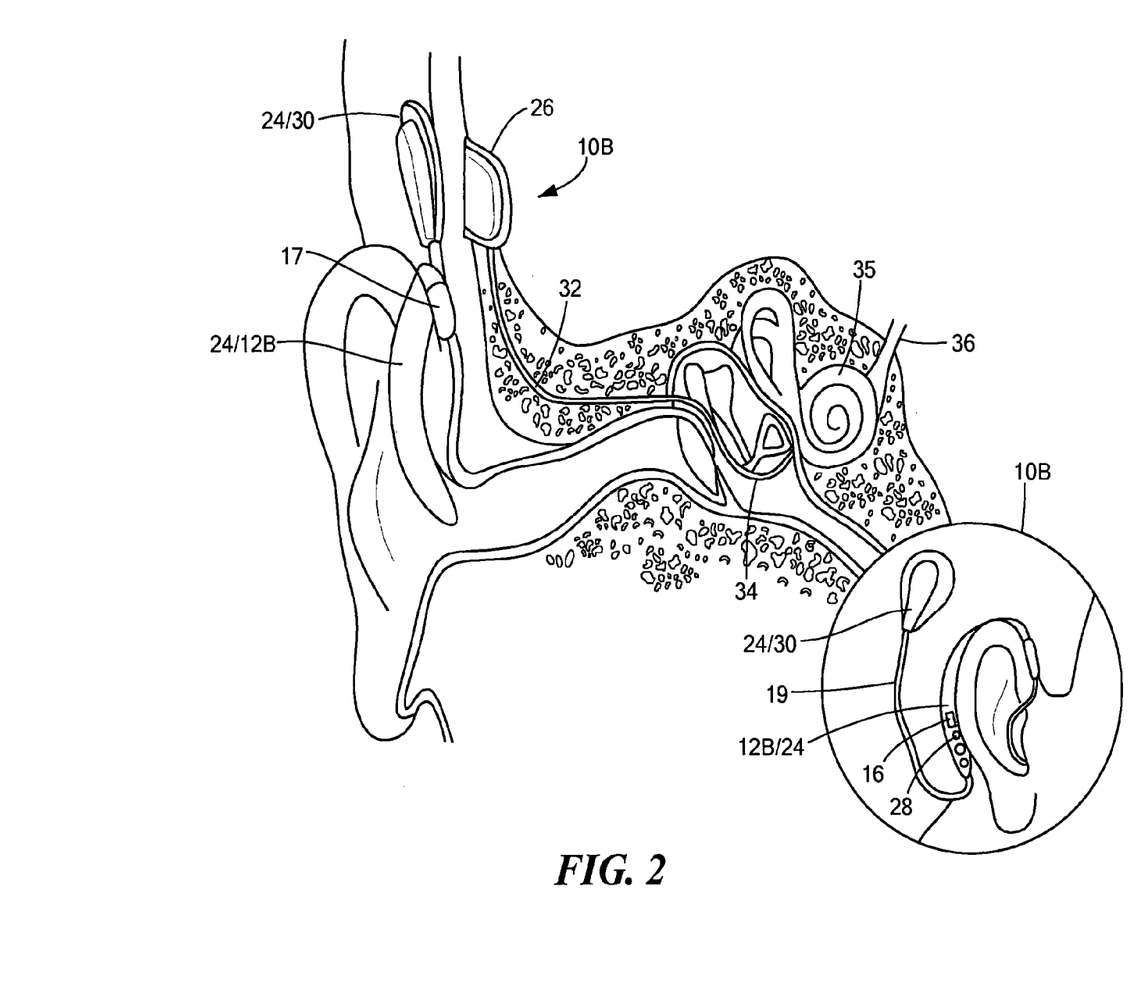
FIG. 2 schematically shows one example of a cochlear implant that may incorporate illustrative embodiments of the invention.

FIG. 2 schematically shows another type of hearing instrument, a cochlear implant 10B, which, in a similar manner, also has significant space constraints for its internal components. At a high level, a cochlear implant 10B has the same function as that of a hearing aid 10A; namely, to help a person hear normally audible sounds. A cochlear implant 10B, however, performs its function in a different manner by having an external portion 24 that receives and processes signals, and an implanted portion 26 physically located within a person's head.

To those ends, the external portion 24 of the cochlear implant 10B has a behind the ear portion with many of the same components as those in a hearing aid 10A behind the ear portion. The larger drawing in FIG. 2 shows this behind the ear portion as a transparent member since the ear covers it, while the smaller drawing of that same figure shows it behind the ear.

Specifically, the behind the ear portion includes a housing/body 12B that contains a microphone 17 for receiving audio signals, internal electronics for processing the received audio signals, a battery, and mechanical controlling features 16 (e.g., knobs) for controlling the internal electronics. Those skilled in the art often refer to this portion as the "sound processor" or "speech processor." A wire 19 extending from the sound processor connects with a transmitter 30 magnetically held to the exterior of a person's head. The speech processor communicates with the transmitter 30 via the wire 19.

The transmitter 30 includes a body having a magnet that interacts with the noted implanted metal portion 26 to secure it to the head, wireless transmission electronics to communicate with the implanted portion 26, and a coil to power the implanted portion 26 (discussed below). Accordingly, the packaged microphone 17 in the sound processor receives audio signals, and transmits them in electronic form to the transmitter 30 through the wire 19, which subsequently wirelessly transmits those signals to the implanted portion 26.

The implanted portion 26 thus has a receiver with a microprocessor to receive compressed data from the external transmitter 30, a magnet having an opposite polarity to that in the transmitter 30 both to hold the transmitter 30 to the person's head and align the coils within the external portion 24/transmitter 30, and a coil that cooperates with the coil in the exterior transmitter 30. The coil in the implanted portion 26 forms a transformer with the coil of the external transmitter 30 to power its own electronics. A bundle of wires 32 extending from the implanted portion 26 passes into the ear canal and terminates at an electrode array 34 mounted within the cochlea 35. As known by those skilled in the art, the receiver transmits signals to the electrode array 34 to directly stimulate the auditory nerve 36, thus enabling the person to hear sounds in the audible range of human hearing.

Indeed, illustrative embodiments of the invention may implement microphone systems 17 in a variety of other underlying devices. For example, among other things, the microphone systems 17 discussed herein may be implemented in mobile telephones, smartphones, cameras, computers, gaming systems, and hand-held public announcement ("PA") devices. Accordingly, discussion of hearing instruments or some other higher level system is for exemplary purposes only and not intended to limit all embodiments of the invention.

Figure 3:
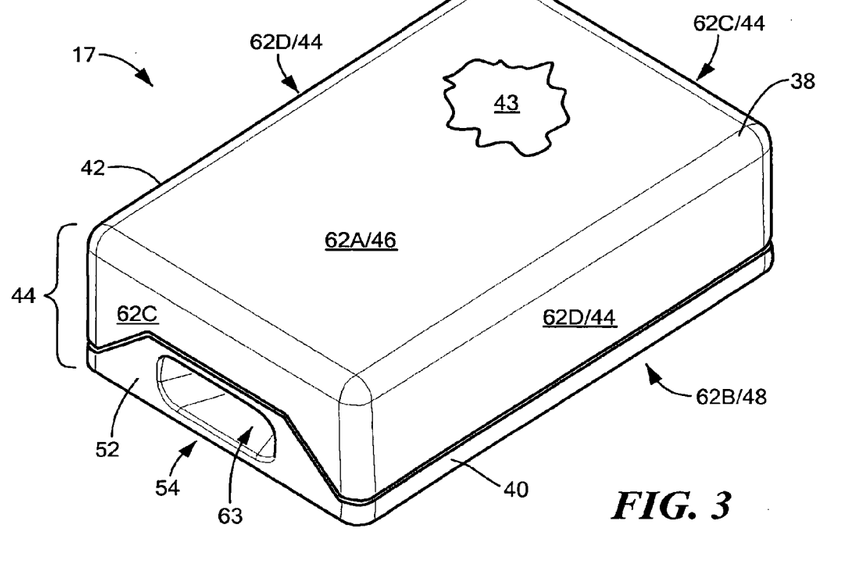
FIG. 3 schematically shows a perspective view of a packaged microphone that may implement illustrative embodiments of the invention.

FIG. 3 schematically shows a packaged microphone system 17 (as noted above, also referred to as a "microphone system 17" or "packaged microphone 17") implemented in accordance with illustrative embodiments of the invention. The packaged microphone 17 has a package 38 that may be coupled with an underlying apparatus, such as a printed circuit board within a hearing instrument 10A or 10B or mobile telephone. The underlying apparatus, however, can have any of a variety of other devices (e.g., other integrated circuits). Accordingly, discussion of a printed circuit board is illustrative and not intended to limit a variety of other embodiments.

The package 38 has a base 40 that, together with a corresponding lid 42, forms an interior chamber 43 containing at least two dies that together receive and process incoming acoustic signals. To form the chamber 43, the lid 42 has four side walls 44 extending downwardly from a substantially planar top surface 46. In a corresponding manner, the base 40 has a generally planar bottom surface 48 with a specially configured top surface as discussed below. One of the sidewalls of the lid 42 has a specially shaped contour to receive a complementary upwardly extending portion 52 of the base 40. That upwardly extending portion 52 of the base 40 forms an audio input port 54 (also referred to as an aperture 54, opening 54 or inlet port 54) that enables ingress of audio/acoustic signals into the chamber 43.

The interior chamber 43 contains a microelectromechanical system microphone die 56 (not shown in this figure, but discussed in detail below with regard to FIGS. 4A and 4B, also known as a "MEMS microphone" or "silicon microphone") for receiving and converting incoming acoustic signals into electronic signals, and a circuit die 58 (also not shown in this figure, but discussed with regard to FIG. 5A) for controlling and processing signals within the system 17. After it is converted into an electrical signal, the acoustic signal is routed out of the package 38 by one or more electrical interconnects through the package 38.

In particular, the bottom face/surface 48 of the package base 40 has a number of external contacts/bond pads 60 (not shown in FIG. 3, but see FIG. 5B) for electrically (and physically, in many anticipated uses) connecting the microphone system 17 with an external apparatus. This connection may be a surface mounted connection, or some other conventional connection. As noted above, the external apparatus may include a printed circuit board or other electrical interconnect apparatus of the next level device (e.g., of a hearing instrument or mobile device). Accordingly, during use, the microphone die 56, and circuit die 58 cooperate to convert audio signals received within its interior into electrical signals, and route those signals through external contacts/bond pads 60 in the base 40 to a circuit board or other external device.

The base 40 and lid 42 may be formed at any of a variety of different types of materials known in the art for this purpose. For example, the base 40 and lid 42 may be produced primarily from injection molded plastic. To protect the microphone die 56 from electromagnetic interference, one or both of the base 40 and lid 42 also may have conductive components. For example, each of the base 40 and lid 42 may have a layer of metal on their interior surfaces, or metal integrated into the interior of their bodies. For example, the base 40 and/or lid 42 may be plated with a layer of copper nickel (CuNi). Alternatively, the injection molded material may have embedded conductive particles. Other embodiments may form the base 40 from printed circuit board material, such as FR-4, ceramic, a carrier substrate, a premolded leadframe package, or other known structures commonly used for those purposes. Like the base 40, the lid 42 also may be formed from other materials, such as metal or circuit board material.

Although it may have rounded exterior corners or other minor details (e.g., grooves or bumps), the package 38 is considered to have six substantially planar sides (generally referred to using reference number 62) having exterior faces/surfaces (hereinafter "faces". In particular, those faces 62 include a top face 62A, a bottom face 62B, and four side faces 62C and 62D. In the embodiment of FIG. 3, for example, the four side faces 62C and 62D include two smaller side faces 62C (along the width of the package 38) and two larger side faces 62D (along the length of the package 38). Each one of these six faces 62A-62D (i.e., the substantial majority of their surface areas) is perpendicular to all of its respective adjoining faces 62, thus forming a rectangular shape as shown in FIG. 3. In other embodiments, however, the package 38 may form a shape other than a rectangle.

The planar exterior surface of one of the smaller side faces 62C defines or forms the above noted inlet port 54, which leads to or forms an opening/mouth 54 (i.e., the above noted inlet port 54) to an acoustic channel 63 that guides this signal to the microphone die 56. As discussed in greater detail below regard to FIG. 5A, this channel 63 extends through the base 40 and redirects the incoming acoustic signal to more directly strike the microphone die 56. Of course, discussion of the channel 63 extending through the base 40 is but one of many potential implementations. For example, the channel 63 may extend through the base 40 and lid 42 together, or through the lid 42 alone.

In alternative embodiments, the acoustic channel 63 is formed through one of the other exterior faces 62. Some other embodiments have multiple inlet ports 54 through the same exterior face 62, or through different exterior faces 62. Accordingly, discussion of the inlet port 54 through the smaller side face 62C is not intended to limit all embodiments of the invention.

Figure 4A:
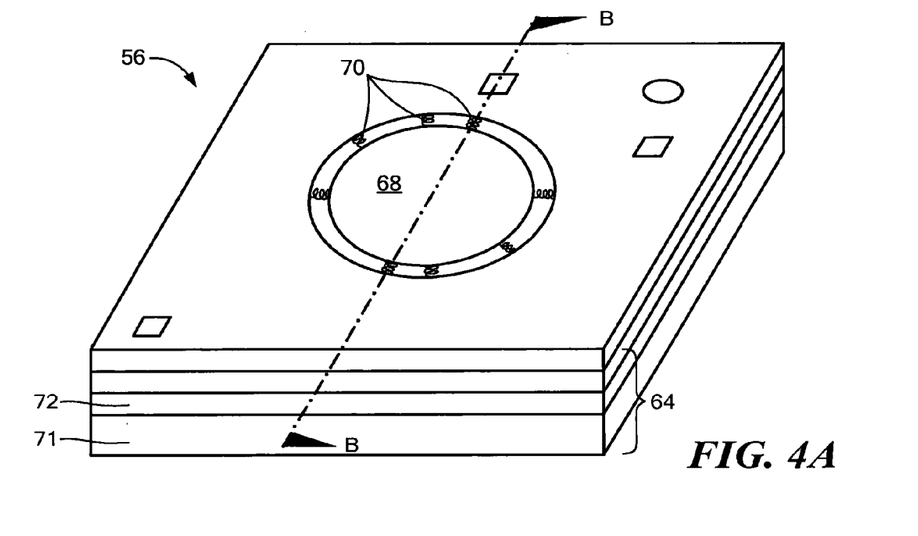
FIG. 4A schematically shows a perspective view of a MEMS microphone that may be used with illustrative embodiments of the invention.
Figure 4B:
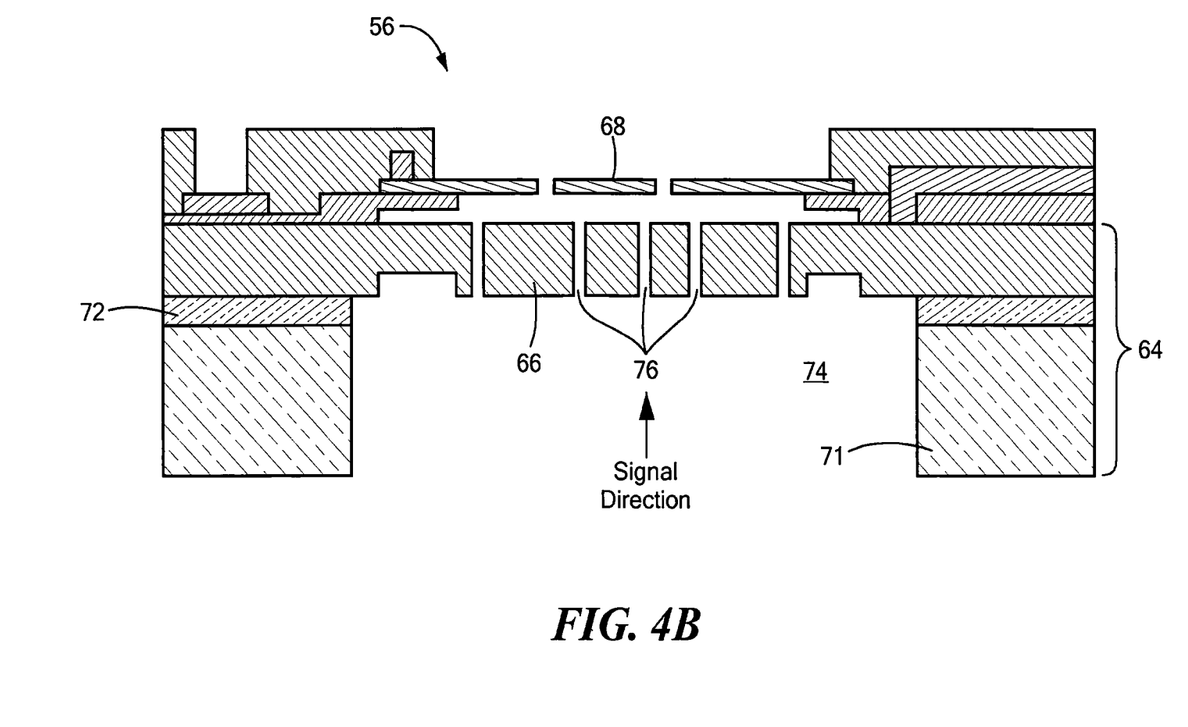
FIG. 4B schematically shows a cross-sectional view of the MEMS microphone of FIG. 5A across line B-B.

The microphone die 56 may be implemented as any of a number of different types of microphone dies. For example, as suggested above, the microphone die 56 may be implemented as a MEMS microphone die. To that end, FIG. 4A schematically shows a top, perspective view of a MEMS microphone die 56 that may be used with illustrative embodiments of the invention. FIG. 4B schematically shows a cross-sectional view of the same MEMS microphone die 56 across line B-B of FIG. 4A. These two figures are discussed simply to detail some exemplary components that may make up a microphone die 56 that may be used in accordance with various embodiments.

As shown in FIGS. 4A and 4B, the microphone die 56 has a chip base 64, one portion of which supports a backplate 66. The microphone die 56 also includes a flexible diaphragm 68 that is suspended by springs 70 over, and movable relative to, the backplate 66. The backplate 66 and diaphragm 68 together form a variable capacitor. In illustrative embodiments, the backplate 66 is formed from single crystal silicon (e.g., a part of a silicon-on-insulator wafer), while the diaphragm 68 is formed from deposited polysilicon. In other embodiments, however, the backplate 66 and diaphragm 68 may be formed from different materials.

In the embodiment shown in FIGS. 4A and 4B, the chip base 64 includes the backplate 66 and other structures, such as a bottom wafer 71 and a buried oxide layer 72 of a silicon-on-insulator (i.e., a SOI) wafer. A portion of the chip base 64 also forms a backside cavity 74 extending from the bottom of the chip base 64 to the bottom of the backplate 66. To facilitate operation, the backplate 66 has a plurality of through-holes 76 that lead to the backside cavity 74.

In operation, as generally noted above, audio/acoustic signals strike the diaphragm 68, causing it to vibrate, thus varying the distance between the diaphragm 68 and the backplate 66 to produce a changing capacitance. Such audio signals may contact the microphone die 56 from any direction. For example, the audio signals may travel upward, first through the backplate 66, and then partially through and against the diaphragm 68. As another example, the audio signals may travel in the opposite direction.

It should be noted that discussion of the specific microphone die 56 is for illustrative purposes only. Other microphone configurations thus may be used with illustrative embodiments of the invention. For example, rather than using an SOI wafer, the microphone die 56 may be formed from a bulk silicon wafer substrate, and/or the backplate 66 may be formed from a deposited material, such as deposited polysilicon.

Side port microphone systems/packaged microphones known to the inventors often have a lower signal-to-noise ratio due to the position of their microphone die relative to their inlet port. Specifically, the microphone die of such microphone systems typically is mounted to its base; namely, orthogonal to the plane of the inlet port. In that case, the acoustic signal does not strike the diaphragm straight on—i.e., orthogonally. Instead, the acoustic signal of such systems are directed generally parallel to the plane of the die and its diaphragm, producing a lower quality signal than desired. In fact, echoes of the acoustic signal can be strong enough to produce a signal-to-noise ratio that is unacceptable in commercially viable systems.

The inventors recognized this problem and, in accordance with illustrative embodiments of the invention, they positioned the microphone die 56 within the interior chamber 43 at an angle to one of the side walls of the package 38. In doing so, they oriented the microphone die 56 so that it more effectively receives the acoustic signal, producing an improved signal output. It should be noted that the side walls of the package 38 typically include the side walls 44 of the lid 42, as well as some of the thinner side walls of the base 40.

Figure 5A:
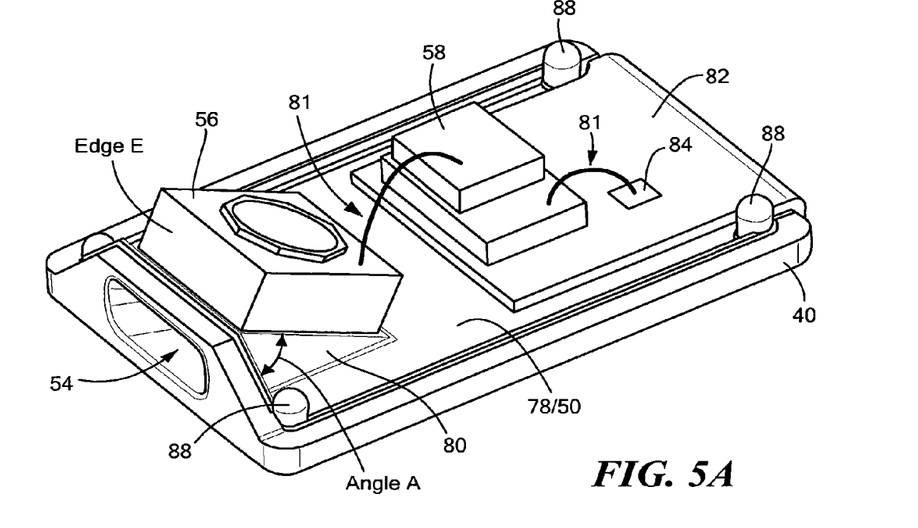
FIG. 5A schematically shows the packaged microphone of FIG. 3 with its lid removed to show the internal components.
Figure 5B:
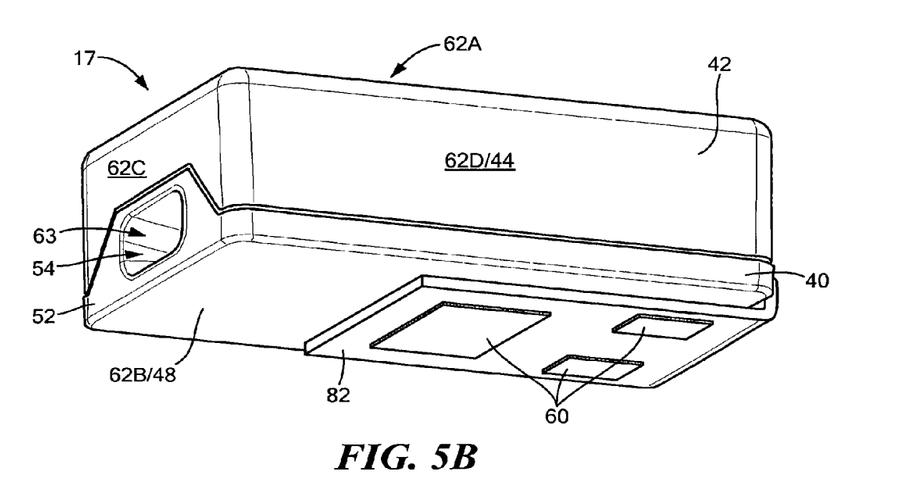
FIG. 5B schematically shows a perspective bottom view of the packaged microphone of FIG. 3.

More specifically, FIG. 5A schematically shows a top perspective view of the base 40 and the components it supports in accordance with illustrative embodiments of the invention, while FIG. 5B schematically shows a bottom view of the package 38. Although FIG. 5A does not show the lid 42, it should be noted that the lid 42 is removed from that figure to highlight features and components within the interior chamber 43. Specifically, FIG. 5A more clearly shows the top surface 50 of the base 40, which has 1) a primary portion 78 that is generally planar and substantially parallel to its bottom surface 48, and 2) and a ramped portion 80 that forms an obtuse angle "OB" (FIG. 5D) with the primary portion 78 and supports the microphone die 56. In addition, the ramped portion 80 also forms the above noted channel 63 that directs the acoustic signal from the input port through the smaller side face 62C of the package 38 to the microphone die 56.

The obtuse angle OB formed between the two base regions preferably is greater than about 90 degrees and less than about 180 degrees. For example, the obtuse angle OB can be about 135 degrees, 140 degrees, 145 degrees, 150 degrees, etc. . . . . Those skilled in the art can select the appropriate angle OB upon a number of design factors, such as the size and shape of the microphone die 56, and the size of the package 38 (particularly the size of the side wall forming the inlet port 54 and, if it forms one, the channel 63). In illustrative embodiments, the angle OB is selected so that the highest edge of the microphone die 56 is very closely spaced to the bottom interior surface of the lid 42.

Accordingly, the microphone die 56, which is mounted to the ramped portion 80, naturally is mounted at an angle to the inlet port 54 through the smaller side external face 62C of the package 38—i.e., its backplate 66 and diaphragm 68 are mounted at an angle relative to the inlet port 54. In illustrative embodiments, this angle is about the same as that of the ramped portion 80, although some embodiments can be different from the angle of the ramped portion 80. In other words, unlike prior art microphone dies known to the inventors, this microphone die 56 is not mounted orthogonally or parallel to the inlet port 54. Instead, it is positioned at a non-orthogonal, non-zero angle with regard to the inlet port 54 through the small side face 62C of the package 38.

This angle, identified in FIG. 5A as "Angle A," preferably is less than ninety degrees and greater than about 1-3 degrees. In illustrative embodiments, Angle A is relatively small, such as on the order of 15-30 degrees. One constraint on the size of Angle A is the position of the top leading edge of the microphone die 56 (identified in FIG. 5A as "Edge E") relative to the bottom interior surface of the lid 42. In illustrative embodiments, Edge E either contacts the bottom lid surface (to minimize Angle A), or forms a very small space with the lid interior surface to simplify production of the package 38 for tolerance purposes.

The channel 63 formed through the package 38 extends between the inlet port/opening 54 and another port/opening in the interior chamber 43 on the ramped portion 80 of the base 40. As such, the channel 63 acoustically couples the microphone die 56 with the inlet port 54. In illustrative embodiments, the channel 63 has a generally smooth internal contour (e.g., no sharp turns or interior corners) that directs the acoustic signal in a manner so that much of it substantially perpendicularly strikes bottom side of the microphone backplate 66 and eventually the diaphragm 68. As an example, FIG. 4B schematically shows an arrow representing one acoustic signal that (at least a portion of which) should strike the backplate 66 first, and then diaphragm 68 in this manner.

Accordingly, the channel 63 is configured to cause the incoming acoustic signal to more directly strike the diaphragm 68, improving the response of the microphone die 56. To that end, as shown in the side view of FIG. 5C and the cross-sectional view of FIG. 5D, the channel 63 can have a curvature. In fact, the channel 63 also can have a tapered shape with a reducing cross-sectional area from the inlet port 54 to the opposite end of the channel 63. This should help capture the acoustic signal at the port 54, and focus that signal as it is directed toward the microphone die 56.

Figure 5C:
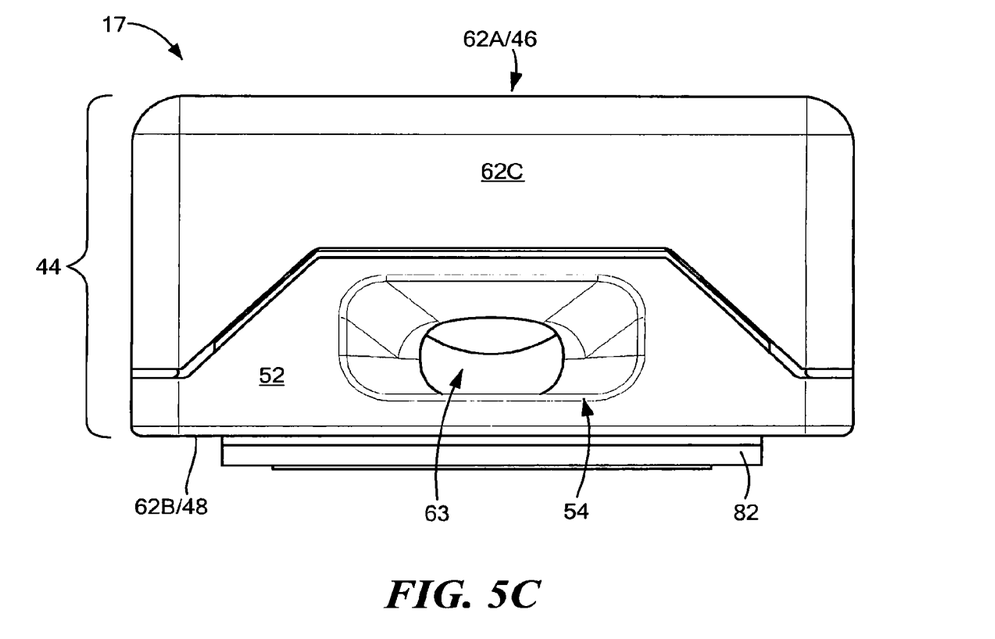
FIG. 5C schematically shows a side view of the packaged microphone of FIG. 3.
Figure 5D:
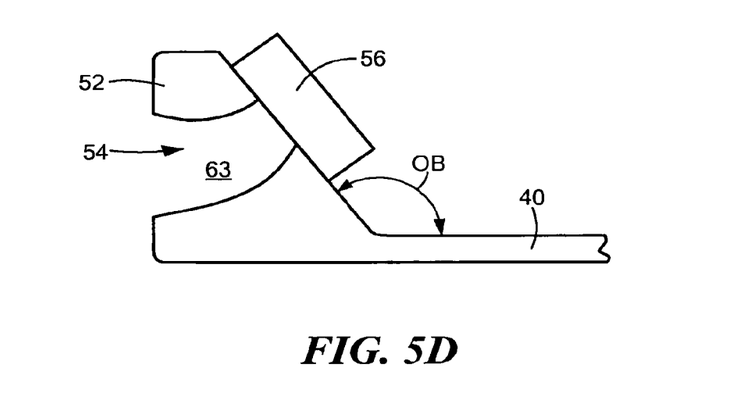
FIG. 5D schematically shows a cross-sectional view of the packaged microphone, focusing on the inlet port and channel leading to the microphone die.

Alternative embodiments, however, may form the channel 63 without a taper, and/or without a smooth internal contour. For example, the channel 63 may have sharp turns, or may direct the signal toward the microphone die 56 in a manner that does not cause perpendicular signal contact with the diaphragm 68. Regardless of the channel shape, these embodiments preferably cause the acoustic signal to strike the bottom of the diaphragm 68, thus effectively producing a substantially large back volume within the interior chamber 43. In some embodiments, rather than strike the bottom of the diaphragm 68, some embodiments can direct the acoustic signal to strike the top of the diaphragm 68, thus negating the improved back volume of the embodiments that strike the bottom of the diaphragm 68.

As noted above, the base 40 preferably is formed from conventional plastic material. Accordingly, when implemented as being integral with the base 40, the ramped portion 80 also is formed from plastic material in the same injection molding process used to form the base 40. Alternative embodiments may form the ramped portion 80 from a component that is secured to the base 40. For example, the ramped portion 80 can be an independently formed plastic, rubber or metal component secured to the base 40 by a conventional adhesive. As another example, the ramped portion 80 could be an independently formed plastic, rubber or metal component that is coupled with the base 40 using conventional two-shot injection molding processes.

As noted above, the interior chamber 43 also contains the above noted circuit die 58. Among other locations, the circuit die 58 may be secured to the primary portion 78 of the base 40, and may include one, two, or more individual dies. Wire bonds 81 or other interconnect devices can electrically connect the microphone die 56 with the circuit die 58.

Some embodiments secure the circuit die 58 directly to the top surface 50 of the base 40. The embodiment shown in FIG. 5A, however, does not make such a connection. Instead, this embodiment secures a substrate 82 to the primary portion 78 of the base 40, which itself supports the circuit die 58. Among other things, the substrate 82 may be formed from a circuit board material, such as a flex circuit board.

As shown by FIGS. 5A and 5B, the flexible circuit board 82 in this embodiment wraps around the base 40, extending from the primary portion 78 within the interior chamber 43 to the bottom face 62B of the package 38. Accordingly, the flex circuit board provides the necessary electrical interconnects from the interior chamber 43 to the exterior of the package 38. To that end, the flex circuit board has a plurality of internal pads 84 for electrically connecting with the dies, and a plurality of external pads 60 for mounting to an external device (e.g., a surface mount connection). Alternative embodiments, however, may provide electrical interconnects directly through the base 40, terminating at surface mountable pads (or other exterior interconnects, such as pins) on the bottom, top, and/or side faces 62A-62D of the package 38. In yet other embodiments, the substrate 82 does not extend outside of the interior chamber 43.

To facilitate package assembly, the base 40 also has a location protrusion 88 at each of its four corners to precisely position the lead on its top surface 50. Each of these protrusions 88 preferably has a rounded top surface to more easily make that connection. Accordingly, because they are injected molded parts, the lid 42 and base 40 should fit together with small tolerances to produce generally planar exterior side faces 62C and 62D. It should be noted that minor differences in tolerances can produce a small discontinuity with any of the side surfaces 62C and 62D and still be within the spirit of various embodiments. In that case, it is anticipated that although part of the exterior side face 62C or 62D may be on a different plane than another part of its face 62C or 62D, both parts should be generally parallel to form one of the side faces 62C or 62D of the rectangular package 38.

Figure 6A:
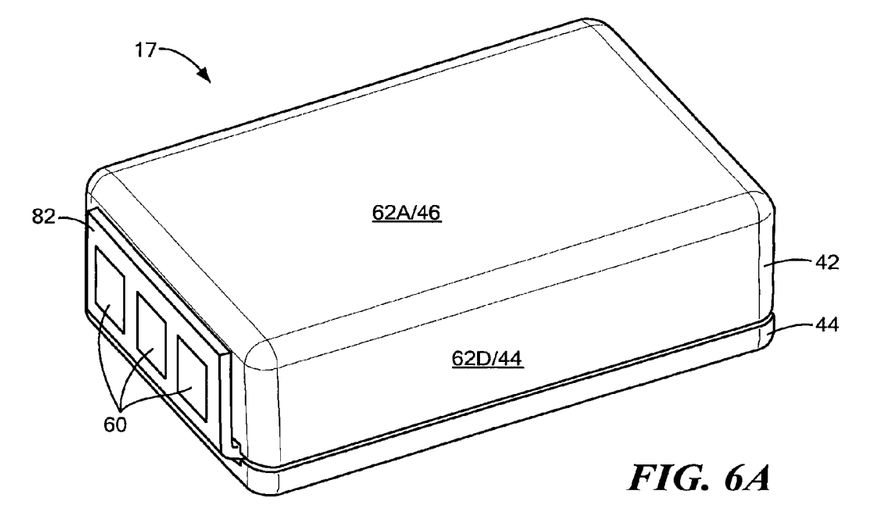
FIG. 6A schematically shows a perspective view of another embodiment of the invention.
Figure 6B:
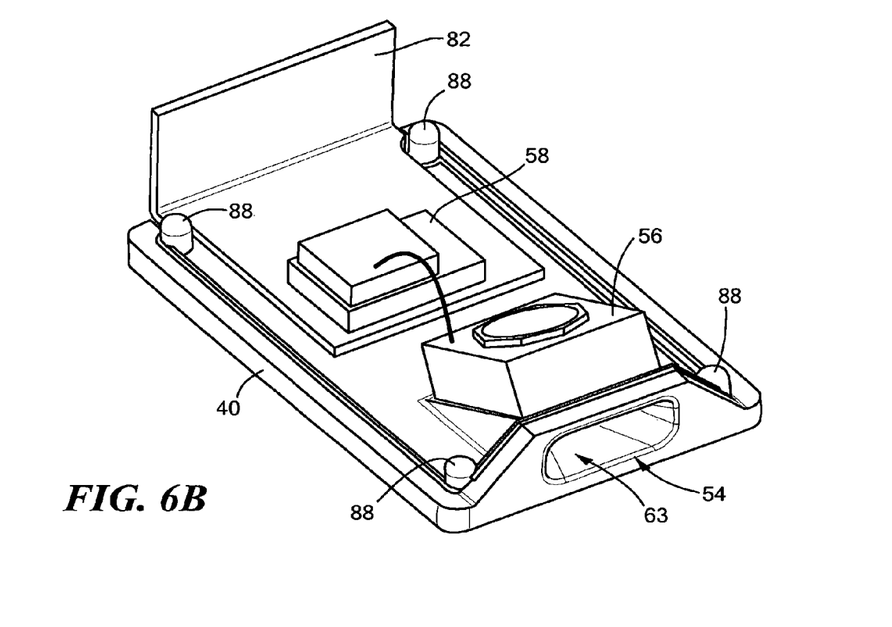
FIG. 6B schematically shows the alternative embodiment of FIG. 6A with the lid removed to show the internal components.

FIG. 6A schematically shows another embodiment of the invention, in which the flexible circuit board 82 is oriented so that its external pads 60 are mounted to one of the side faces 62C or 62D of the package 38. FIG. 6B shows that same embodiment without the lid 42 to detail some of the interior features and components. Other than pad placement, this embodiment shares many of the same characteristics of the embodiments described above.

Figure 7:
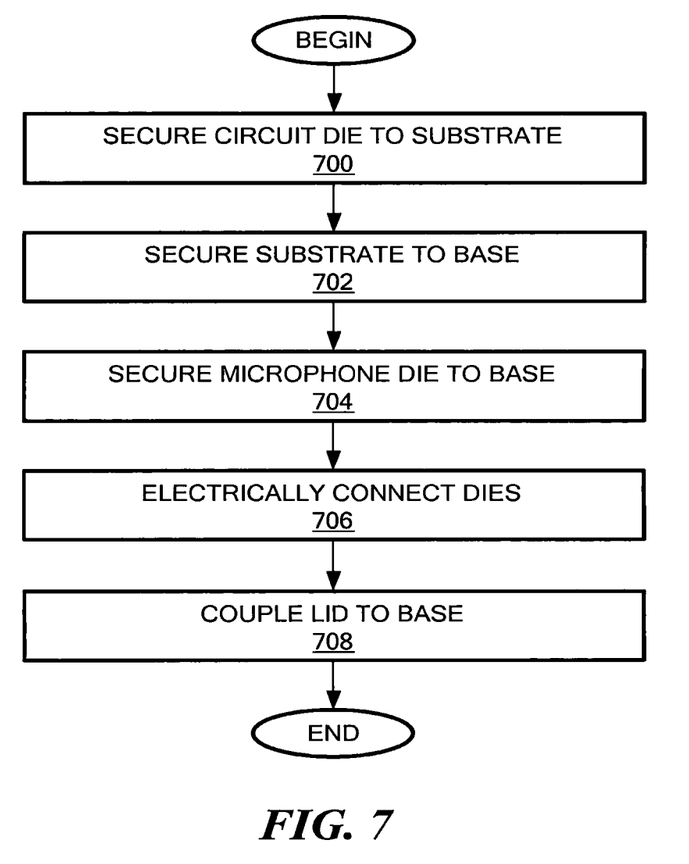
FIG. 7 shows a process of forming a packaged microphone, such as the microphones shown in FIGS. 3 and 6A, in accordance with illustrative embodiments of the invention.

FIG. 7 shows a process of forming a packaged microphone, such as one of the microphone systems 17 shown in FIGS. 3 and 6A, in accordance with illustrative embodiments of the invention. Although this process is discussed in terms of the microphone system 17 of FIG. 3, it can be applied to other embodiments, such as that shown in FIG. 6A or others not explicitly discussed. It should be noted that this process is a simplified version of an actual fabrication process they can have many more steps. For example, this process may have a testing step, or additional steps for performing one of the noted steps. In addition, many of the steps of the process can be performed in a different order than that disclosed. For example, steps 702 and 704 can be performed in a different order. In fact, some steps can be performed at substantially the same time. Accordingly, this process is but one of many different illustrative processes that may implement various embodiments the invention.

It also is contemplated that illustrative embodiments of the process will be performed using batch production processes. In other words, the process typically may be completed on a plurality of microphone systems 17 at the same time—in parallel. Accordingly, discussion of fabricating a single microphone system 17 is for simplicity purposes only.

The process begins at step 700, which secures the circuit die 58 to the substrate 82 by any of a number of conventional methods. For example, the method may apply a conventional adhesive or die attach epoxy between the bottom of the circuit die 58 and the top of the substrate 82. Alternatively, the circuit die 58 may form a flip-chip connection onto the substrate 82.

Next, the process secures the substrate 82 with its secured circuit die 58 to the primary portion 78 of the base 40, and to the bottom surface 48 of the base 40. Again, in a manner similar to the process of securing the circuit die 58, the substrate 82 may be secured to the base 40 by any of a number of conventional methods, such as using a thermal adhesive, or epoxy tape.

Step 704 then secures the microphone die 56 to the ramped portion 80 of the base 40 by any of a number of conventional methods, such as those described above with regard to the circuit die 58 (e.g., using a die attach epoxy). In illustrative embodiments, when using the microphone die 56 shown in FIGS. 4A and 4B, the microphone die 56 is mounted such that its backplate 66 and backside cavity 74 are directly adjacent to the surface of the ramped portion 80. In this case, there are no intervening components between the surface of the ramped portion 80 and the backside cavity 74.

Acoustic signals therefore pass through the backside cavity 74 and backplate 66 to contact or strike the diaphragm 68—preferably in an orthogonal manner as described above. Alternatively, the microphone die 56 may be configured so that it is mounted with its diaphragm 68 directly adjacent to the surface of the ramped portion 80.

After securing both the microphone die 56 and circuit die 58 to the base 40, step 706 electrically connects both dies together, and to the base 40. Among other ways, the method may use a conventional wire bond 81 connecting between the two dies. Alternatively or in addition, each die 56 and 58 may have a wire bond 81 connecting to the substrate 82 or some other electrical conductor on the base 40. In yet another embodiment, one or both of the dies are flip-chip connected to the substrate 82. Those skilled in the art can use combinations of these noted electrical connection techniques, or others conventionally known techniques that are not discussed, to make the required electrical connections.

At this stage in the process, the base 40 is substantially complete. Accordingly, step 708 couples the lid 42 to the base 40. To that end, conventional processes place the lid 42 onto the base 40 so that the base location protrusions 88 relatively closely contact the inner surface of the lid walls. More specifically, each location protrusion 88 of the base 40 is positioned at one open corner of the lid 42 to provide a precise connection with minimal discontinuities on the side exterior surfaces 62C and 62D. The location protrusions 88 thus precisely guide and position the lid 42 onto the base 40. Again, as with other steps, conventional techniques may secure the base 40 to the lid 42. For example, the process may use a conventional epoxy to connect the lid 42 and the base 40.

The substrate 82, which is sandwiched between a portion of the base 40 and the lid 42 as it extends between the interior and exterior of the package 38, can present a challenge for sealing the interior chamber 43. To meet this design concern, in illustrative embodiments, the lid 42 has an indented portion to accommodate the extra thickness that the substrate 82 adds to the base 40 where it exits the interior chamber 43. Accordingly, the adhesive should sufficiently seal that side of the lid 42 against both the base 40 and the substrate 82 to the extent necessary. In illustrative embodiments, the seal between the base 40 and the lid 42 is at least sufficient to prevent direct signal access to the interior chamber 43 other than though the inlet port 54.

Of course, other techniques may connect the lid 42 to the base 40. For example, the process may ultrasonically weld the lid 42 to the base 40, and use some additional process to connect and seal the lid 42 and the substrate 82.

Accordingly, illustrative embodiments of the invention improve the signal-to-noise ratio of side port microphones by specially orienting the microphone die 56 relative to its inlet port 54. This should enable a higher quality output signal within a small form factor for applications/devices having limited spacing and mounting options, such as those required by the hearing instruments 10A and 10B.

Although the above discussion discloses various exemplary embodiments of the invention, it should be apparent that those skilled in the art can make various modifications that will achieve some of the advantages of the invention without departing from the true scope of the invention.

What is claimed is:

1. A microphone system comprising: a base having a top surface, a bottom surface, a primary portion and a ramped portion, the primary portion being generally planar and substantially parallel to the bottom surface, the ramped portion generally forming an obtuse angle "OB" with the primary portion, the base additionally having at least one side with an upwardly extending portion, the OB formed between two base regions;

a lid coupled with the base to form a package with an interior chamber, the upwardly extending portion of the base forming an audio input port, the audio input port positioned externally to the interior chamber for receiving an acoustic signal, the upwardly extending portion and the ramped portion forming an opening through which the received acoustic signal is guided; a microphone die positioned within the interior chamber and on top of the ramped portion at an angular position corresponding to the OB of the ramped portion, wherein the ramped portion is positioned under the microphone die to support said microphone die and forms a channel that directs the acoustic signal from the audio input port through a side face of the package to the microphone die, wherein the base further has at least one location protrusion to position the lid on the top surface of the base.

2. The microphone system of claim 1, wherein a sidewall of the lid has a specially shaped contour receiving the upwardly extending portion of the base, the upwardly extending portion being complementary to the specially shaped contour.

3. The microphone system of claim 1, wherein the package has a substantially rectangular shape.

4. The microphone system of claim 1, wherein the package has a shape other than a substantially rectangular shape.

5. The microphone system of claim 1, wherein the microphone die is a MEMS microphone die.

6. The microphone system of claim 1, wherein the lid has a plurality of sidewalls, one of the sidewalls of the lid having a specially shaped contour to receive the upwardly extending portion.

7. The microphone system of claim 1, wherein the channel is formed through the package extending between the opening and a port in the interior chamber on the ramped portion of the base.

8. The microphone system of claim 1, wherein the channel has a generally smooth internal contour.

9. The microphone system of claim 1, wherein the channel is configured to direct the acoustic signal in a manner as to hit a backplate of the microphone and eventually hit a diaphragm of the microphone.

* * * * *